US009105808B2

(12) United States Patent
Petrovski

(10) Patent No.: US 9,105,808 B2
(45) Date of Patent: Aug. 11, 2015

(54) THERMOELECTRIC DEVICE

(75) Inventor: Dusko Petrovski, Washington, MI (US)

(73) Assignee: Gentherm Incorporated, Northville, MI (US)

( * ) Notice: Subject to any disclaimer, the term of this patent is extended or adjusted under 35 U.S.C. 154(b) by 1355 days.

(21) Appl. No.: 11/972,544

(22) Filed: Jan. 10, 2008

(65) Prior Publication Data

US 2008/0173022 A1 Jul. 24, 2008

Related U.S. Application Data

(60) Provisional application No. 60/884,306, filed on Jan. 10, 2007.

(51) Int. Cl.

*F25B 21/00* (2006.01)
*F25B 21/02* (2006.01)
*H05B 1/00* (2006.01)
(Continued)

(52) U.S. Cl.

CPC .............. *H01L 35/32* (2013.01); *B60N 2/5628* (2013.01); *F25B 2321/0212* (2013.01)

(58) Field of Classification Search

CPC .......... F25B 21/02; F25B 21/00; F25B 21/04; F25B 2321/02; B60H 1/00285; F24F 5/0042
USPC ...................................... 62/3.2, 3.7; 219/217
See application file for complete search history.

(56) References Cited

U.S. PATENT DOCUMENTS 3,136,577 A 6/1964 Richard
3,137,523 A 6/1964 Karner
(Continued)

FOREIGN PATENT DOCUMENTS

DE 19503291 6/1998
DE 29911519 11/2000
(Continued)

OTHER PUBLICATIONS

International Search Report for Application No. PCT/US2008/050803 mailed Jul. 11, 2008 (PCT/US2008/050803 claims priority to the same provisional application, U.S. Appl. No. 60/951,431, as the present application).

(Continued)

*Primary Examiner* — Allen Flanigan
*Assistant Examiner* — Filip Zec
(74) *Attorney, Agent, or Firm* — Knobbe, Martens, Olson & Bear, LLP

(57) ABSTRACT

A thermoelectric system includes a pair of substrates, a plurality of semiconductor elements, and first, second, and third terminals. The semiconductor elements are positioned between the opposing faces of the substrates, and the semiconductor elements include at least two groups of dissimilar semiconductor elements. The semiconductor elements are electrically coupled in series by conductor elements arranged so the two groups of dissimilar semiconductor elements are connected in an alternating pattern. The first, second and third terminals are connected to the conductor elements with the third terminal positioned between the first and second terminals. The electrically coupled semiconductor elements include first nodes and second nodes. The first and second nodes emit or absorb heat according to electric current flowing through the semiconductor elements, and impedance of the thermoelectric system is controlled by switching the switch.

12 Claims, 9 Drawing Sheets

(51) Int. Cl.

| | |
|---|---|
| ***H05B 3/00*** | (2006.01) |
| ***H05B 11/00*** | (2006.01) |
| ***H01L 35/32*** | (2006.01) |
| ***B60N 2/56*** | (2006.01) |

(56) References Cited

U.S. PATENT DOCUMENTS 3,138,934 A 6/1964 Roane
3,178,894 A 4/1965 Mole et al.
3,615,870 A 10/1971 Crouthamel
3,632,451 A 1/1972 Abbott
3,648,469 A * 3/1972 Chapman ........................ 62/3.5
4,224,565 A 9/1980 Sosniak et al.
4,281,516 A 8/1981 Berthet et al.
4,413,857 A 11/1983 Hayashi
4,493,939 A 1/1985 Blaske et al.
4,549,134 A 10/1985 Weiss
4,671,567 A 6/1987 Frobose
4,685,727 A 8/1987 Cremer et al.
4,812,733 A 3/1989 Tobey
4,828,627 A 5/1989 Connery
4,859,250 A 8/1989 Buist
4,923,248 A 5/1990 Feher
4,947,648 A 8/1990 Harwell et al.
5,002,336 A 3/1991 Feher
5,012,325 A 4/1991 Mansuria et al.
5,057,490 A 10/1991 Skertic
5,077,709 A 12/1991 Feher
5,106,161 A 4/1992 Meiller
5,117,638 A 6/1992 Feher
5,148,977 A 9/1992 Hibino et al.
5,166,777 A 11/1992 Kataoka
5,188,286 A 2/1993 Pence, IV
5,385,382 A 1/1995 Single, II et al.
5,409,547 A 4/1995 Watanabe
5,430,322 A 7/1995 Koyanagi et al.
5,493,864 A 2/1996 Pomerene et al.
5,576,512 A 11/1996 Doke
5,597,200 A 1/1997 Gregory et al.
5,623,828 A 4/1997 Harrington
5,626,021 A 5/1997 Karunasiri et al.
5,637,921 A 6/1997 Burward-Hoy
5,650,904 A 7/1997 Gilley et al.
5,690,849 A 11/1997 DeVilbiss et al.
5,704,213 A 1/1998 Smith et al.
5,761,908 A 6/1998 Oas et al.
5,761,909 A 6/1998 Hughes et al.
5,802,855 A 9/1998 Yamaguchi et al.
5,850,741 A 12/1998 Feher
5,884,485 A 3/1999 Yamaguchi et al.
5,887,304 A 3/1999 Von der Heyde
5,895,964 A 4/1999 Nakayama
5,921,314 A 7/1999 Schuller et al.
5,924,289 A 7/1999 Bishop, II
5,924,766 A 7/1999 Esaki et al.
5,927,817 A 7/1999 Ekman et al.
5,934,748 A 8/1999 Faust et al.
5,936,192 A 8/1999 Tauchi
6,000,225 A 12/1999 Ghoshal
6,003,950 A 12/1999 Larsson
6,019,420 A 2/2000 Faust et al.
6,038,865 A 3/2000 Watanabe et al.
6,048,024 A 4/2000 Wallman
6,059,018 A 5/2000 Yoshinori et al.
6,062,641 A 5/2000 Suzuki et al.
6,072,924 A 6/2000 Sato et al.
6,079,485 A 6/2000 Esaki et al.
6,084,172 A 7/2000 Kishi et al.
6,085,369 A 7/2000 Feher
6,100,463 A 8/2000 Ladd et al.
6,105,373 A 8/2000 Watanabe et al.
6,112,531 A 9/2000 Yamaguchi
6,119,463 A 9/2000 Bell
6,127,619 A 10/2000 Xi et al.
6,145,925 A 11/2000 Eksin et al.
6,161,388 A * 12/2000 Ghoshal .......................... 62/3.7
6,164,076 A 12/2000 Chu et al.
6,186,592 B1 2/2001 Orizakis et al.
6,189,966 B1 2/2001 Faust et al.
6,196,627 B1 3/2001 Faust et al.
6,206,465 B1 3/2001 Faust et al.
6,223,539 B1 5/2001 Bell
6,256,996 B1 7/2001 Ghoshal
6,262,357 B1 7/2001 Johnson et al.
6,263,530 B1 7/2001 Feher
6,266,962 B1 7/2001 Ghoshal
6,282,907 B1 9/2001 Ghoshal
6,326,610 B1 12/2001 Muramatsu et al.
6,338,251 B1 1/2002 Ghoshal
6,385,976 B1 5/2002 Yamamura et al.
6,410,971 B1 6/2002 Otey
6,452,740 B1 9/2002 Ghoshal
6,474,073 B1 11/2002 Uetsuji et al.
6,489,551 B2 12/2002 Chu et al.
6,492,585 B1 12/2002 Zamboni et al.
6,509,704 B1 1/2003 Brown
6,539,725 B2 4/2003 Bell
6,548,894 B2 4/2003 Chu et al.
6,552,256 B2 4/2003 Shakouri et al.
RE38,128 E 6/2003 Gallup et al.
6,598,251 B2 7/2003 Habboub et al.
6,604,785 B2 8/2003 Bargheer et al.
6,606,866 B2 8/2003 Bell
6,619,736 B2 9/2003 Stowe et al.
6,626,488 B2 9/2003 Pfahler
6,644,735 B2 11/2003 Bargheer et al.
6,676,207 B2 1/2004 Rauh et al.
6,686,532 B1 2/2004 Macris
6,700,052 B2 3/2004 Bell
6,705,089 B2 3/2004 Chu et al.
6,725,669 B2 4/2004 Melaragni
6,727,422 B2 4/2004 Macris
6,739,138 B2 5/2004 Saunders et al.
6,743,972 B2 6/2004 Macris
6,761,399 B2 7/2004 Bargheer et al.
6,767,766 B2 7/2004 Chu et al.
6,786,541 B2 9/2004 Haupt et al.
6,786,545 B2 9/2004 Bargheer et al.
6,804,966 B1 10/2004 Chu et al.
6,808,230 B2 10/2004 Buss et al.
6,817,191 B2 11/2004 Watanabe
6,818,817 B2 11/2004 Macris
6,823,678 B1 11/2004 Li
6,828,528 B2 12/2004 Stowe et al.
6,840,305 B2 1/2005 Zheng et al.
6,841,957 B2 1/2005 Brown
6,855,880 B2 2/2005 Feher
6,857,697 B2 2/2005 Brennan et al.
6,893,086 B2 5/2005 Bajic et al.
6,907,739 B2 6/2005 Bell
6,954,944 B2 10/2005 Feher
6,976,734 B2 12/2005 Stoewe
6,981,380 B2 1/2006 Chrysler et al.
7,040,710 B2 5/2006 White et al.
7,070,232 B2 7/2006 Minegishi et al.
7,108,319 B2 9/2006 Hartwich et al.
7,111,465 B2 9/2006 Bell
7,114,771 B2 10/2006 Lofy et al.
7,124,593 B2 10/2006 Feher
7,131,689 B2 11/2006 Brennan et al.
7,141,763 B2 11/2006 Moroz
7,147,279 B2 12/2006 Bevan et al.
7,168,758 B2 1/2007 Bevan et al.
7,178,344 B2 2/2007 Bell
7,201,441 B2 4/2007 Stoewe et al.
7,272,936 B2 9/2007 Feher
7,425,034 B2 9/2008 Bajic et al.
7,462,028 B2 12/2008 Cherala et al.
7,475,464 B2 1/2009 Lofy et al.
7,480,950 B2 1/2009 Feher
7,506,938 B2 3/2009 Brennan et al.
7,587,901 B2 9/2009 Petrovski
7,591,507 B2 9/2009 Giffin et al.
7,640,754 B2 1/2010 Wolas

(56) References Cited

U.S. PATENT DOCUMENTS 7,665,803 B2 2/2010 Wolas
7,708,338 B2 5/2010 Wolas
RE41,765 E 9/2010 Gregory et al.
7,827,620 B2 11/2010 Feher
7,827,805 B2 11/2010 Comiskey et al.
7,862,113 B2 1/2011 Knoll
7,866,017 B2 1/2011 Knoll
7,877,827 B2 2/2011 Marquette et al.
7,937,789 B2 5/2011 Feher
7,963,594 B2 6/2011 Wolas
7,966,835 B2 6/2011 Petrovski
7,969,738 B2 6/2011 Koo
7,996,936 B2 8/2011 Marquette et al.
8,065,763 B2 11/2011 Brykalski et al.
8,104,295 B2 1/2012 Lofy
8,143,554 B2 3/2012 Lofy
8,181,290 B2 5/2012 Brykalski et al.
8,191,187 B2 6/2012 Brykalski et al.
8,222,511 B2 7/2012 Lofy
8,256,236 B2 9/2012 Lofy
8,332,975 B2 12/2012 Brykalski et al.
8,402,579 B2 3/2013 Marquette et al.
8,418,286 B2 4/2013 Brykalski et al.
8,434,314 B2 5/2013 Comiskey et al.
8,438,863 B2 5/2013 Lofy
RE44,272 E 6/2013 Bell
8,505,320 B2 8/2013 Lofy
8,516,842 B2 8/2013 Petrovski
8,539,624 B2 9/2013 Terech et al.
8,575,518 B2 11/2013 Walsh
8,621,687 B2 1/2014 Brykalski et al.
8,732,874 B2 5/2014 Brykalski et al.
8,782,830 B2 7/2014 Brykalski et al.
8,893,329 B2 11/2014 Petrovski
2002/0062854 A1 5/2002 Sharp
2003/0039298 A1 2/2003 Eriksson
2003/0041892 A1 3/2003 Fleurial et al.
2003/0110779 A1 6/2003 Otey et al.
2003/0145380 A1 8/2003 Schmid
2004/0090093 A1 5/2004 Kamiya et al.
2004/0098991 A1 5/2004 Heyes
2004/0113549 A1 6/2004 Roberts et al.
2004/0255364 A1 12/2004 Feher
2005/0076944 A1 4/2005 Kanatzidis et al.
2005/0078451 A1 4/2005 Sauciuc et al.
2005/0121065 A1 6/2005 Otey
2005/0161072 A1 7/2005 Esser et al.
2005/0285438 A1 12/2005 Ishima et al.
2006/0005548 A1 1/2006 Ruckstuhl
2006/0053529 A1 3/2006 Feher
2006/0087160 A1 4/2006 Dong et al.
2006/0137099 A1 6/2006 Feher
2006/0137358 A1 6/2006 Feher
2006/0201161 A1 9/2006 Hirai et al.
2006/0214480 A1 9/2006 Terech
2006/0225773 A1 10/2006 Venkatasubramanian et al.
2006/0237166 A1 10/2006 Otey et al.
2006/0244289 A1 11/2006 Bedro
2006/0273646 A1 12/2006 Comiskey et al.
2007/0086757 A1 4/2007 Feher
2007/0095378 A1 5/2007 Ito et al.
2007/0095383 A1 5/2007 Tajima
2007/0200398 A1 8/2007 Wolas et al.
2007/0204629 A1 9/2007 Lofy
2007/0234742 A1 10/2007 Aoki et al.
2007/0251016 A1 11/2007 Feher
2007/0256722 A1 11/2007 Kondoh
2007/0262621 A1 11/2007 Dong et al.
2007/0277313 A1 12/2007 Terech
2008/0000025 A1 1/2008 Feher
2008/0047598 A1 2/2008 Lofy
2008/0053509 A1 3/2008 Flitsch et al.
2008/0087316 A1 4/2008 Inaba et al.
2008/0148481 A1 6/2008 Brykalski et al.
2008/0155990 A1 7/2008 Gupta et al.
2008/0163916 A1 7/2008 Tsuneoka et al.
2008/0164733 A1 7/2008 Giffin et al.
2008/0166224 A1 7/2008 Giffin et al.
2008/0173022 A1 7/2008 Petrovski
2008/0223841 A1 9/2008 Lofy
2009/0000031 A1 1/2009 Feher
2009/0025770 A1 1/2009 Lofy
2009/0026813 A1 1/2009 Lofy
2009/0033130 A1 2/2009 Marquette et al.
2009/0126110 A1 5/2009 Feher
2009/0193814 A1 8/2009 Lofy
2009/0211619 A1 8/2009 Sharp et al.
2009/0218855 A1 9/2009 Wolas
2010/0001558 A1 1/2010 Petrovski
2010/0011502 A1 1/2010 Brykalski et al.
2010/0193498 A1 8/2010 Walsh
2011/0048033 A1 3/2011 Comiskey et al.
2011/0115635 A1 5/2011 Petrovski et al.
2011/0253340 A1 10/2011 Petrovski
2011/0271994 A1 11/2011 Gilley
2011/0296611 A1 12/2011 Marquette et al.
2012/0080911 A1 4/2012 Brykalski et al.
2012/0104000 A1 5/2012 Lofy
2012/0114512 A1 5/2012 Lofy et al.
2012/0131748 A1 5/2012 Brykalski et al.
2012/0227182 A1 9/2012 Brykalski et al.
2012/0261399 A1 10/2012 Lofy
2012/0319439 A1 12/2012 Lofy
2013/0086923 A1 4/2013 Petrovski et al.
2013/0097776 A1 4/2013 Brykalski et al.
2013/0097777 A1 4/2013 Marquette et al.
2013/0198954 A1 8/2013 Brykalski et al.
2013/0206852 A1 8/2013 Brykalski et al.
2013/0227783 A1 9/2013 Brykalski et al.
2013/0239592 A1 9/2013 Lofy
2013/0269106 A1 10/2013 Brykalski et al.
2014/0007594 A1 1/2014 Lofy
2014/0026320 A1 1/2014 Marquette et al.
2014/0062392 A1 3/2014 Lofy et al.
2014/0090829 A1 4/2014 Petrovski
2014/0130516 A1 5/2014 Lofy
2014/0131343 A1 5/2014 Walsh
2014/0237719 A1 8/2014 Brykalski et al.
2014/0250918 A1 9/2014 Lofy
2014/0260331 A1 9/2014 Lofy et al.
2014/0305625 A1 10/2014 Petrovski
2014/0310874 A1 10/2014 Brykalski et al.
2014/0338366 A1 11/2014 Adldinger et al.
2015/0013346 A1 1/2015 Lofy

FOREIGN PATENT DOCUMENTS

DE 10238552 8/2001
DE 10115242 10/2002
GB 978057 12/1964
JP 04-052470 6/1990
JP 2000-164945 6/2000
JP 2004-055621 2/2004
JP 2006001392 1/2006
JP 2006076398 3/2006
WO WO 99/58907 11/1999
WO WO 02/11968 2/2002
WO WO 03/051666 6/2003

OTHER PUBLICATIONS

Feher, Steve, Thermoelectric Air Conditioned Variable Temperature Seat (VTS) & Effect Upon Vehicle Occupant Comfort, Vehicle Energy Efficiency, and Vehicle Environment Compatibility, SAE Technical Paper, Apr. 1993, pp. 341-349.

Lofy, J. et al., Thermoelectrics for Environmental Control in Automobiles, Proceeding of Twenty-First International Conference on Thermoelectrics (ICT 2002), published 2002, pp. 471-476.

* cited by examiner

THERMOELECTRIC DEVICE

CROSS-REFERENCE TO RELATED APPLICATIONS

This application claims the priority benefit under 35 U.S.C. §119(e) of U.S. Provisional Application Ser. No. 60/884,306, filed Jan. 10, 2007, the entirety of which is hereby incorporated by reference herein.

BACKGROUND OF THE INVENTION

1. Field of the Inventions

The present application relates generally to thermoelectric devices, and more specifically, to thermoelectric devices configured for use in climate control systems for seating assemblies and the like.

2. Description of the Related Art

A Peltier circuit is a type of thermoelectric device that comprises two sides, each of which is either heated or cooled when current is delivered through the circuit. For example, when voltage is applied in a first direction through the thermoelectric device, one side generally generates heat while the opposite side absorbs heat. The thermoelectric device can be configured so that switching the polarity of the circuit can create the opposite effect. Typically, thermoelectric devices comprise a closed circuit that includes dissimilar materials. As a DC voltage is applied across the closed circuit, a temperature change is generated at the junction of the dissimilar materials. Thus, depending on the direction that electrical current flows through the thermoelectric device, heat is either emitted or absorbed. Thermoelectric devices can include several such junctions connected electrically in series. The junctions can be sandwiched between two ceramic plates that generally form the cold side and the hot side of the device. The cold side and hot side can be thermally coupled to one or more heat transfer devices (e.g., fins) that help heat the heat transfer with a volume of air or other fluid.

A vehicle ventilation system that includes such a thermoelectric device to selectively heat and/or cool a seating assembly is disclosed in U.S. patent application Ser. No. 11/047,077, filed on Jan. 31, 2005 and published as U.S. Patent Publication No. 2006/0130490. Thus, air or other fluid can be passed through or near the cold and/or hot side of a thermoelectric device (e.g., Peltier circuit) to selectively heat and/or cool the air or other fluid. The thermally conditioned air or other fluid can then be directed to one or more portions of the vehicle seat (e.g., seat back portion, seat bottom portion, neck area, etc.). Such arrangements can be particularly advantageous because thermoelectric devices are typically compact and simple.

SUMMARY

A thermoelectric system according a first embodiment of the invention comprises a pair of substrates, a plurality of semiconductor elements, and first, second, and third terminals. Each of the pair of opposing substrates has a peripheral edge and a face that generally opposes a face of the other opposing substrate. In some embodiments, the plurality of semiconductor elements are positioned between the opposing faces of the opposing substrates. In other embodiments, the plurality of semiconductor elements comprises at least two groups of dissimilar semiconductor elements. The plurality of semiconductor elements are electrically coupled in series by conductor elements arranged so the two groups of dissimilar semiconductor elements are connected in an alternating pattern.

In other arrangements, the first, second and third terminals are connected to the conductor elements with the third terminal being positioned between the first and second terminals along the circuit created by the plurality of semiconductor elements electrically coupled in series by conductor elements, and the third terminal comprises a switch. In some embodiments, the electrically coupled semiconductor elements comprise a plurality of first nodes and a plurality of second nodes. The first and second nodes emit or absorb heat according to electric current flowing through the semiconductor elements, and impedance of the thermoelectric system is controlled by switching the switch provided in the third terminal.

A thermoelectric system according to a second embodiment of the present invention comprises first and second couples of and second dissimilar conductive elements, a first terminal, a second terminal and a third terminal. The first and second dissimilar conductive elements of the first couple are connected to each other at a first common node, and the first couple comprises a first end and a second end. In some embodiments, the first and second dissimilar conductive elements of the second couple are connected to each other at a second node, and the second couple comprises a first end and a second end. The first end of the second couple is connected to the second end of the first couple at a second node. In one embodiment, the first terminal is connected to the first end of the first couple, the second terminal to the second end of the second couple, and the third terminal to the second node through a switch. The switch controls the impedance of the thermoelectric system by switching electric current through the third terminal. The switching of the switch may be associated with flowing direction of the electric current through the thermoelectric system.

In some embodiments, the first terminal may be connected to a first voltage, and the second terminal to a second voltage. The switch may be open such that electric current flows through the first and second couples of first and second dissimilar conductive elements. The first terminal may be connected to a first voltage, and the second terminal to a second voltage. The third terminal may be connected to the second voltage, and the switch may be closed such that electric current flows only through the first couple of first and second dissimilar conductive elements.

A thermoelectric system according to another embodiment of the present invention comprises first and second dissimilar conductive elements, first and second terminals, and a third terminal. The first dissimilar conductive element has a first end and a second end. The second dissimilar conductive element has a first end and a second end, and the first end of the second dissimilar conductive element is connected to the second end of the first dissimilar conductive element. In some embodiments, the first terminal is connected to the first end of the first dissimilar conductive element. And the second terminal is connected to the second end of the second dissimilar conductive element at a first node. Further, the third terminal is connected to a contact point between the first end of the first dissimilar conductive element and the first node through a switch.

In some embodiments, the switch controls impedance of the thermoelectric system by switching electric current through the third terminal. The switch may comprise a slidable leg connected to the contact point between the first end of the first dissimilar conductive element and the first node. In one embodiment, the switch comprises multiple taps connected to a plurality of contact points between the first end of the first dissimilar conductive element and the first node, and the switch closes one of the multiple taps when activated. In other embodiments, the switch is configured to select one of the multiple taps, and electric current through the first dissimilar conductive element is controlled by selecting of one of the multiple taps.

BRIEF DESCRIPTION OF THE DRAWINGS

These and other features, aspects and advantages of the present inventions are described with reference to drawings of certain preferred embodiments, which are intended to illustrate, but not to limit, the present inventions. The drawings include sixteen (16) figures. It is to be understood that the attached drawings are for the purpose of illustrating concepts of the present inventions and may not be to scale.

DETAILED DESCRIPTION OF THE PREFERRED EMBODIMENTS

The thermoelectric devices disclosed herein and the various systems and features associated with them are described in the context of a climate control system for a seating assembly (e.g., automobile seat, bed, sofa, etc.) because they have particular utility in this context. However, the various embodiments, discussed and/or illustrated herein can be used in other contexts as well, such as, for example, but without limitation, other heating and/or cooling devices or systems.

Figure 1:
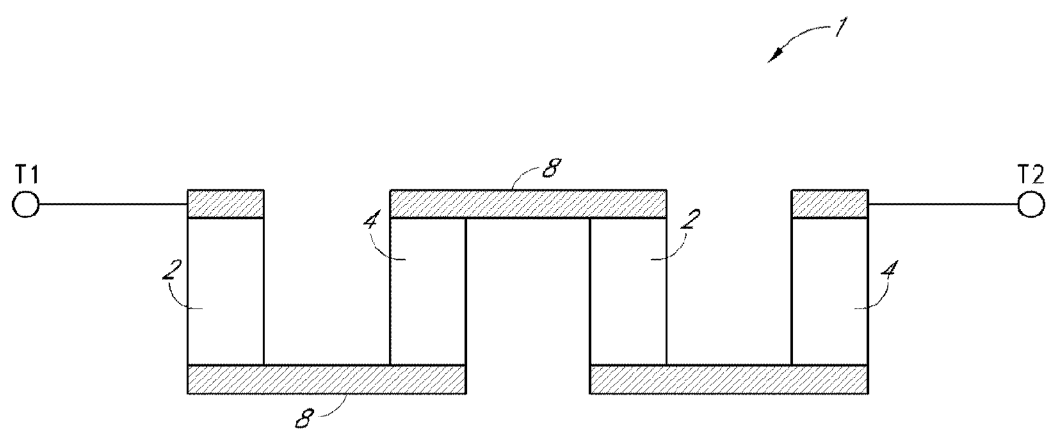
FIG. 1 schematically illustrates one embodiment of a thermoelectric device having two terminals.

With reference to the schematic of FIG. 1, a thermoelectric device 1 can include a pair of terminals T1, T2 that are located at opposite ends. In some or all of the embodiments disclosed herein, the thermoelectric device 1 comprises a Peltier circuit. However, the thermoelectric device 1 can comprise a different type of electrical circuit or configuration. Thus, the features and benefits described herein can be applied to any type of electrical arrangement that is used to selectively heat and/or cool a volume of air or other fluid. In the embodiment illustrated in FIG. 1, a DC voltage may be applied across the thermoelectric device 1 between the end terminals T1, T2. As described in greater detail herein, the cooling or heating effect of the thermoelectric device 1 can be selectively reversed by switching the polarity of the applied voltage at the terminals T1, T2.

As illustrated in FIG. 1, the thermoelectric device 1 can include a plurality of dissimilar conductive elements 2, 4 that are arranged in series. Pairs of conductive elements 2, 4 can be coupled together by a series of opposing conductor tabs 8, which in turn, can be situated between a pair of opposing substrates (see FIG. 8). Each substrate can be thermally coupled to fins or other heat transfer members (not shown) through a thermal conductive element.

In some arrangements, the thermoelectric device 1 is configured to be operated at a fixed voltage, such as, for example, the voltage of a battery to which it is electrically connected (e.g., approximately 13.5V if a typical automotive battery is utilized). The impedance or other electrical characteristics of the thermoelectric device 1 can be selected to produce the optimal cooling affect at a specific voltage. However, in fixed voltage systems, the chosen impedance is typically not optimal when the direction of the electrical current through the thermoelectric device 1 is reversed (e.g., to produce heat).

Figure 2:
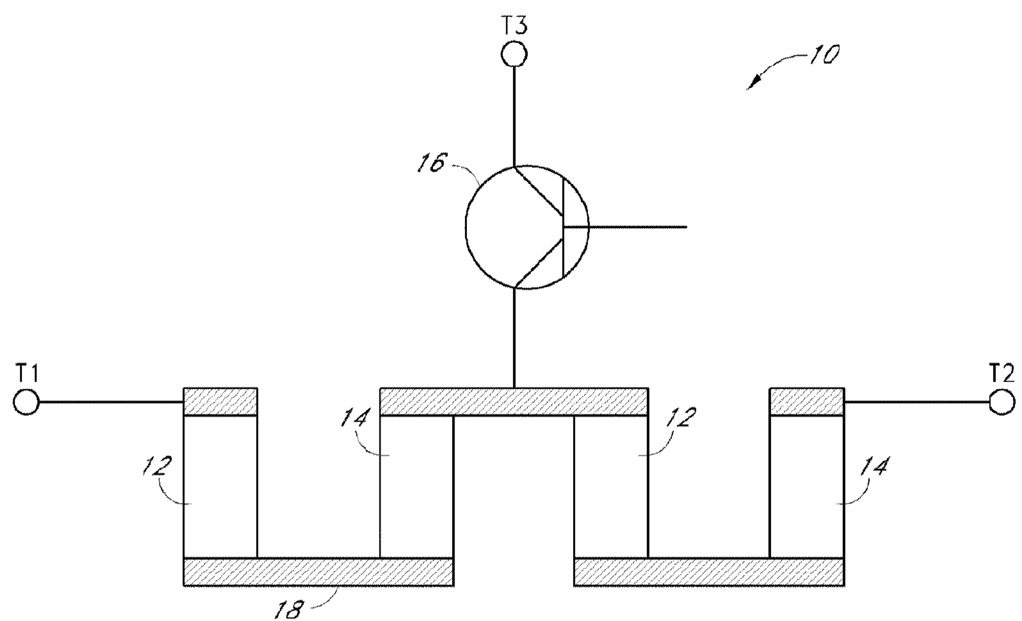
FIG. 2 schematically illustrates a thermoelectric device comprising three terminals according to one embodiment.

FIG. 2 illustrates another embodiment of a thermoelectric device 10 that includes more than two electrical terminals T1, T2, T3. As described herein, such a configuration can permit for multiple levels of heating and/or cooling. In FIG. 2, the thermoelectric device 10 comprises a total of three terminals T1, T2, T3. Two of the terminals T1, T2 are end terminals generally located at opposite ends of the circuit. The third terminal T3 is an intermediate terminal located between the end terminals T1, T2.

In some embodiments, the operational voltage to the third terminal T3 can be controlled by a hard wire contact, by an electronic switch 16 and/or some other method or device. A thermoelectric device 10 comprising one or more intermediate terminals T3 can be used to selectively energize one or more desired portions of the circuit. Thus, unlike conventional two terminal thermoelectric devices (FIG. 1), such a modified thermoelectric device 10 can be configured to vary the heating and/or cooling effect when the amount of electrical current being delivered to the device 10 is generally constant. It will be appreciated that the position of the third terminal T3 (or any additional intermediate terminals) can be varied as desired or required by a particular application or use. For example, the intermediate terminal T2 can be located approximately halfway between the end terminals T1, T2. In other embodiments, the intermediate terminal T3 can be located closer to one of the end terminals T1, T2.

With continued reference to FIG. 2, the electronic switch 16 can be a semiconductor switch, such as, for example, an integrated field-effect transistor (FET) switch or the like. Thus, as discussed, the switch 16 can be used to vary the impedance through the thermoelectric device 10. For example, the impedance of the device 10 can be increased when a cooling effect is desired (e.g., the voltage is directed between the end terminals T1, T2) or decreased when a heating effect is desired (e.g., the voltage is directed between an end terminal T1, T2 and an intermediate terminal T3). Thus, depending on the desired heating and/or cooling effect, electrical current can be delivered through only a portion of the thermoelectric device 10.

With further reference to FIG. 2, a thermoelectric device 10 can comprise a first thermoelectric material 12 and a second thermoelectric material 14, both of which are connected in series by a plurality of conductor elements 18. As discussed, the device 10 can further comprise a first terminal T1 at one end of the circuit, a second terminal T2 at another end of the circuit and a third terminal T3 positioned along an intermediate location generally between the first and second terminals T1, T2. In some embodiments, the first terminal T1 is connected to a first voltage and the second terminal T2 is connected to a second voltage. Further, the third terminal T3 can be connected to the second voltage through a switch 16 (e.g., hard wire contact, electronic switch 16, etc.).

Therefore, when the device 10 operates in a first mode (e.g., cooling), the switch 16 can be opened such that the difference between the first and second voltages is applied between the first and second terminals T1, T2 (e.g., the end terminals). Accordingly, electrical current can flow through the entire or substantially the entire circuit (e.g., through the first and second thermoelectric materials 12, 14 in series). Alternatively, when the device 10 operates in a second mode (e.g., heating), the switch 16 can be closed such that electrical current is applied through only a portion of the circuit (e.g., between the second and third terminals T2, T3). This can effectively reduce the impedance of the device 10 and create a different level of heating and/or cooling for a particular fixed voltage, as desired or required by a particular application or use.

Figure 3:
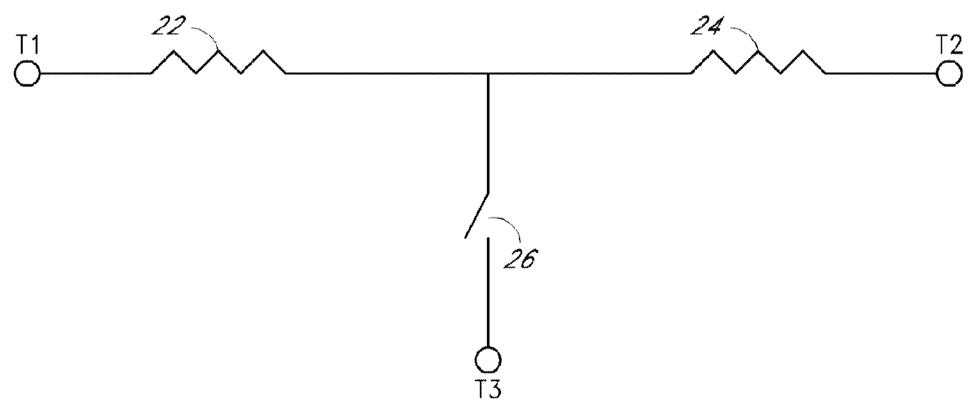
FIG. 3 illustrates one embodiment of a circuit diagram of a thermoelectric device with three terminals and a switch having a hard wire tap.
Figure 4:
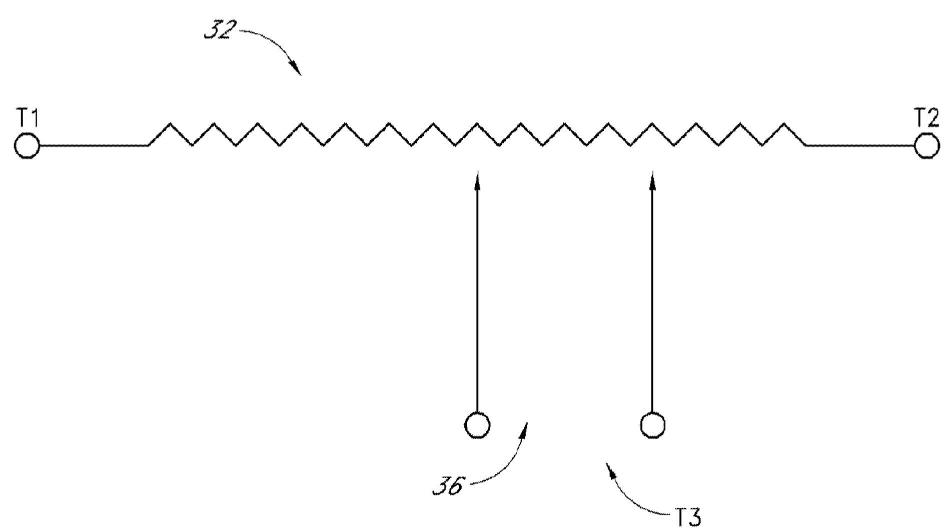
FIG. 4 illustrates a circuit diagram of a thermoelectric device having three terminals and a switch according to one embodiment.

With reference to FIG. 3, the switching of the intermediate terminal T3 can be accomplished using a semi-conductor switch 26 or other similar device. In addition, as illustrated in FIG. 4, the selective switching of the intermediate terminal T3 can be accomplished through a hard wire tap 36. In other embodiments, a semiconductor switch can be incorporated into the thermoelectric materials of a device. In such arrangements, the need for a high current carrying wire could be eliminated.

It should be appreciated that the direction of the electrical current through any of the devices described and/or illustrated herein can be reversed to create a different heating and/or cooling effect, as desired or required. Thus, a thermoelectric device can be sized, designed and otherwise configured for a particular heating effect at a specific fixed voltage. When the electrical current is reversed to create a cooling effect, the thermoelectric device can comprise one or more intermediate terminals to selectively direct the current through only a portion of the circuit. Consequently, for a specific voltage, both a desired heating and cooling effect can be attained using the same thermoelectric device.

As discussed, thermoelectric devices that comprise one or more intermediate terminals can be sized, designed and otherwise configured to create a generally optimized cooling and/or heating effect at a specific voltage (e.g., the voltage provided by a car battery or other DC power source). Without an intermediate terminal, it may be difficult to create a desired opposite thermal conditioning effect (e.g., heating and/or cooling) when the current is reversed. This is because in fixed voltage systems the impedance used to create a desired thermal conditioning effect in a first thermal conditioning mode (e.g., cooling) is unlikely to create a desired opposite thermal conditioning effect in a second mode (e.g., heating). Therefore, the use of intermediate terminals and switches or other current routing devices to selectively modify the impedance through the device to create a desired heating and/or cooling effect.

In some embodiments, a power system for an automobile or other vehicle typically includes a battery that provides approximately 13.5 volts when the alternator is properly operating. In certain arrangements, two circuits (e.g., the circuits disclosed in FIG. 1) can be connected in series to effectively provide about half of the battery's voltage across these circuits. A thermoelectric device can be configured to provide optimum or close to optimum cooling at a specific voltage (e.g., the voltage supplied by an automobile battery). However, this may impact the amount of heating that could be obtained through the circuit when the electrical current is reversed. Thus, using a thermoelectric device that includes an intermediate terminal, as illustrated and discussed herein, the circuit can be designed to provide a desired cooling and/or heating effect at the full voltage of the battery without sacrificing performance when operating in the opposite thermal conditioning mode (e.g., heating and/or cooling). Such embodiments can reduce the need to place the circuits in series, resulting in less complicated control modules. In addition, optimal or near optimal cooling and/or heating can be achieved using the same substrate at a particular voltage.

Figures 5A, 5B, 5C:
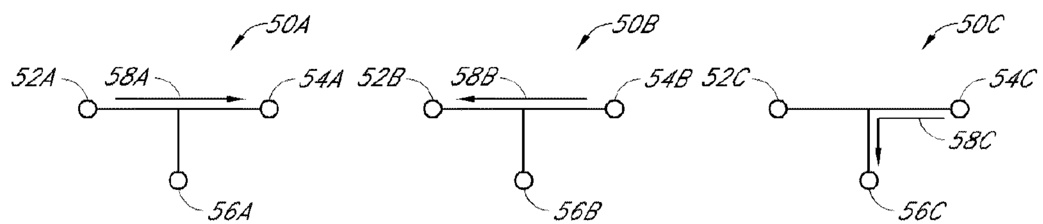
FIGS. 5A-5C schematically illustrate circuit diagrams for various embodiments of a thermoelectric device comprising an intermediate terminal.

Schematic circuit diagrams of different embodiments of a thermoelectric device 50A, 50B, 50C comprising an intermediate terminal 56A, 56B, 56C are illustrated in FIGS. 5A-5C. In FIG. 5A, the depicted thermoelectric device 50A comprises two end terminals 52A, 54A and one intermediate terminal 56A. In the illustrated schematic, the intermediate terminal 56A is located approximately halfway between the two end terminals 52A, 54A. However, in other embodiments, the intermediate terminal 56A can be located closer to one of the two end terminals 52A, 54A, as desired or required by a particular application.

As discussed, in order to energize the thermoelectric device 50A, a current can be supplied between two terminals. In FIG. 50A, the electrical current is directed between the two end terminals 52A, 54A in the direction generally indicated by arrow 58A (e.g., from 52A to 54A). Consequently, under this operational scheme, electrical current is not permitted in the direction of the intermediate terminal 56A. In one embodiment, the flow of electrical current in the direction of arrow 58A creates a cooling effect along a first side of the thermoelectric device 50A.

When the direction of electrical current is reversed, as schematically illustrated in FIG. 5B (e.g., from one end terminal 54B towards 52B in a direction generally represented by arrow 58B), a heating effect can be created along the first side of the thermoelectric device 50B.

As discussed in greater detail herein, electrical current can be routed from an end terminal 52C, 54C to and/or from an intermediate terminal 56C. For example, in the embodiment illustrated in FIG. 5C, electrical current can be directed from end terminal 54C to intermediate terminal 56C in a direction generally represented by arrow 58C. This can enable a user to direct electrical current through only a portion of the thermoelectric device 50C. Consequently, the extent to which the thermoelectric device 50C produces a heating and/or cooling effect can be selectively controlled. For example, if the current delivered to the end terminals 54B, 54B is identical and if the thermoelectric devices 50B, 50C are similarly configured, the heating effect created along the first side of the thermoelectric device 50C illustrated in FIG. 5C will be less than that created along the first side of the device 50B of FIG. 5B. Similarly, if current is directed from the end terminal 52A to the intermediate terminal 56A in FIG. 5A, the cooling effect along the first side of the thermoelectric device 50A can be reduced.

Figures 6A, 6B:
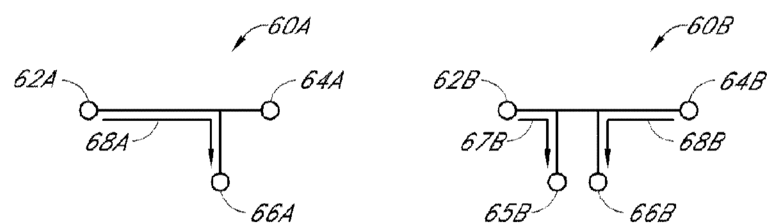
FIGS. 6A and 6B schematically illustrate circuit diagrams for other embodiments of a thermoelectric device comprising an intermediate terminal.

In FIG. 6A, the illustrated thermoelectric device includes an intermediate terminal 66A that is located closer to one of the end terminals 64A. Such designs and configurations can be used to selectively control the level of heating and/or cooling occurring at or near a thermoelectric device. In FIG.

6A, electrical current is routed from one end terminal 62A to the intermediate terminal 66A in a direction generally represented by arrow 68A. Thus, the level of heating and/or cooling created by the thermoelectric device 60A can be greater than the level of heating and/or cooling created by routing current from the opposite end terminal 64A to the intermediate terminal 66A.

FIG. 6B schematically illustrates an embodiment of a thermoelectric device 60B that comprises two intermediate terminals 65B, 66B. As with other embodiments discussed and illustrated herein, the intermediate terminals 65B, 66B can be located at any position along the length of the thermoelectric device 60B. Further, a thermoelectric device 60B can include more or fewer intermediate terminals 65B, 66B as desired or required by a particular application or use.

As discussed, electrical current can be delivered, in any direction, between two terminals 62B, 64B, 65B, 66B. For example, current can be directed from any end terminal 62B, 64B to another end terminal 64B, 62B or from any end terminal 62B, 64B to an intermediate terminal 65B, 66B. Likewise, current can be directed from any intermediate terminal 65B, 66B to any end terminal 62B, 64B or from any intermediate terminal 65B, 66B to any other intermediate terminal 66B, 65B.

For example, as illustrated in FIG. 6B, under one operational scheme, current can be directed from one end terminal 62B to one of the intermediate terminals 65B in a direction generally represented by arrow 67B. Likewise, under a different operational scheme, current can be directed from the other end terminal 64B to another intermediate terminal 66B in a direction generally represented by arrow 68B. As discussed, under other operation schemes, the thermoelectric device 60B can be configured to deliver electrical current between any two electrical terminals 62B, 64B, 65B, 66B, regardless of whether they are end terminals or intermediate terminals.

Figures 7A, 7B:
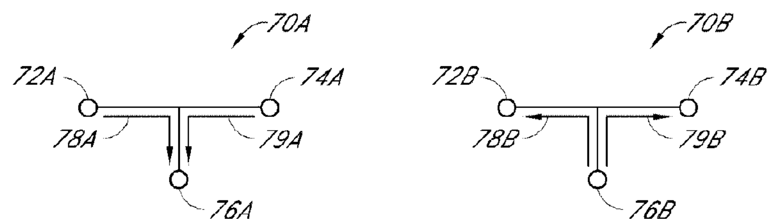
FIGS. 7A and 7B schematically illustrate circuit diagrams for yet other embodiments of a thermoelectric device comprising an intermediate terminal.

FIGS. 7A and 7B illustrate embodiments of circuit diagrams in which electrical current can be simultaneously delivered through two different portions of a thermoelectric device 70A, 70B. For example, in FIG. 7A, current is routed from one end terminal 72A to an intermediate terminal 76A in a direction generally represented by arrow 78A to create a heating or cooling effect along a first side of the device 70A. At the same time, current is routed from one end terminal 74A to the same intermediate terminal 76A in a direction generally represented by arrow 79A to create the opposite thermal effect along a first side of the device 70A. Therefore, under such an operational scheme, a portion of the thermoelectric device 70A can be heated while another portion can be cooled. As illustrated in FIG. 7B, when the electrical current is reversed, the cooled and heated portions of the thermoelectric device 70B can also be advantageously reversed.

Figure 8:
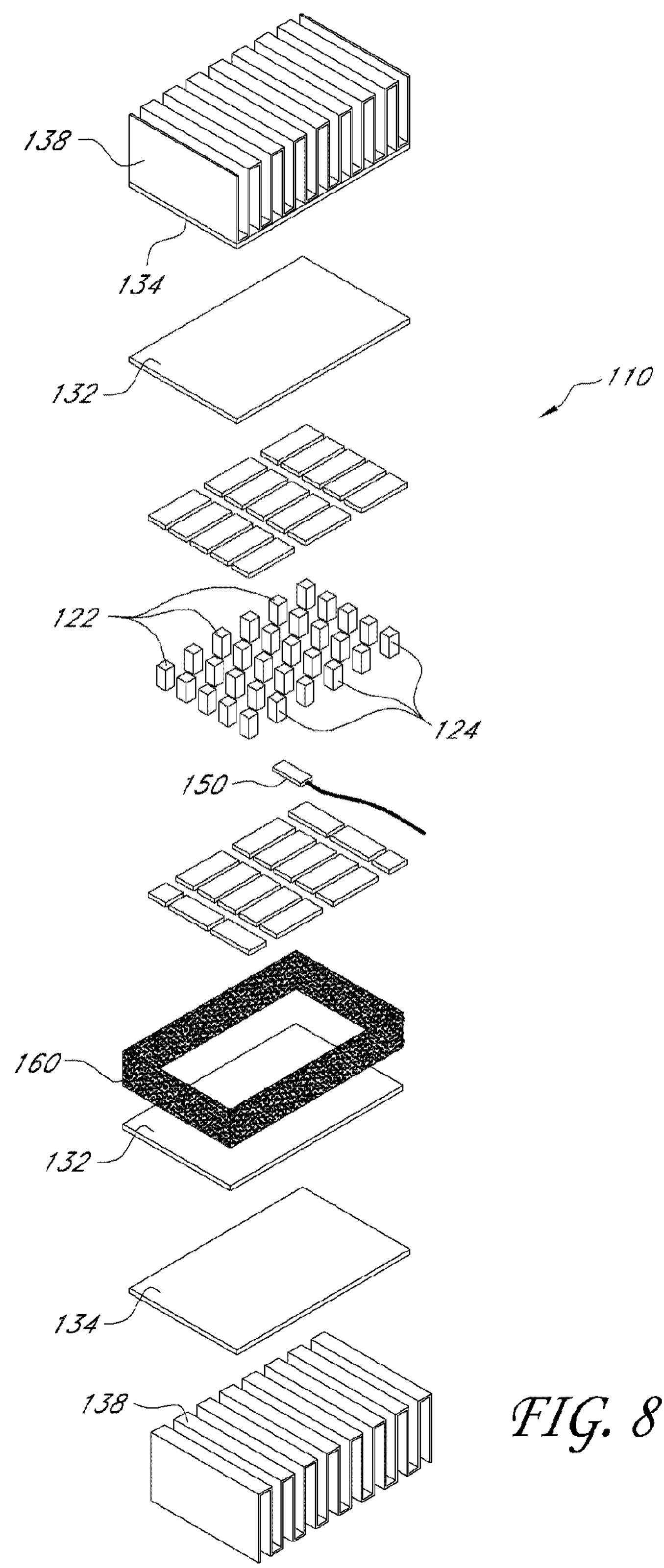
FIG. 8 illustrates an exploded perspective view of a thermoelectric device according to one embodiment.
Figure 9:
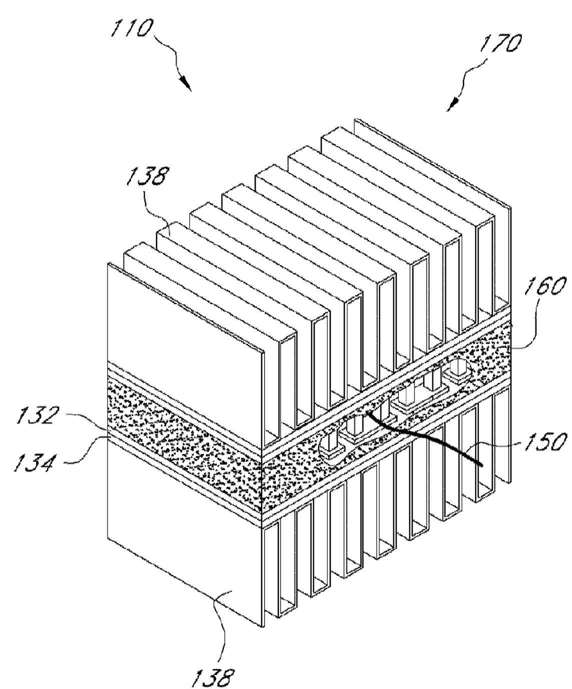
FIG. 9 is a side perspective view of the assembled thermoelectric device of FIG. 8.
Figure 10:
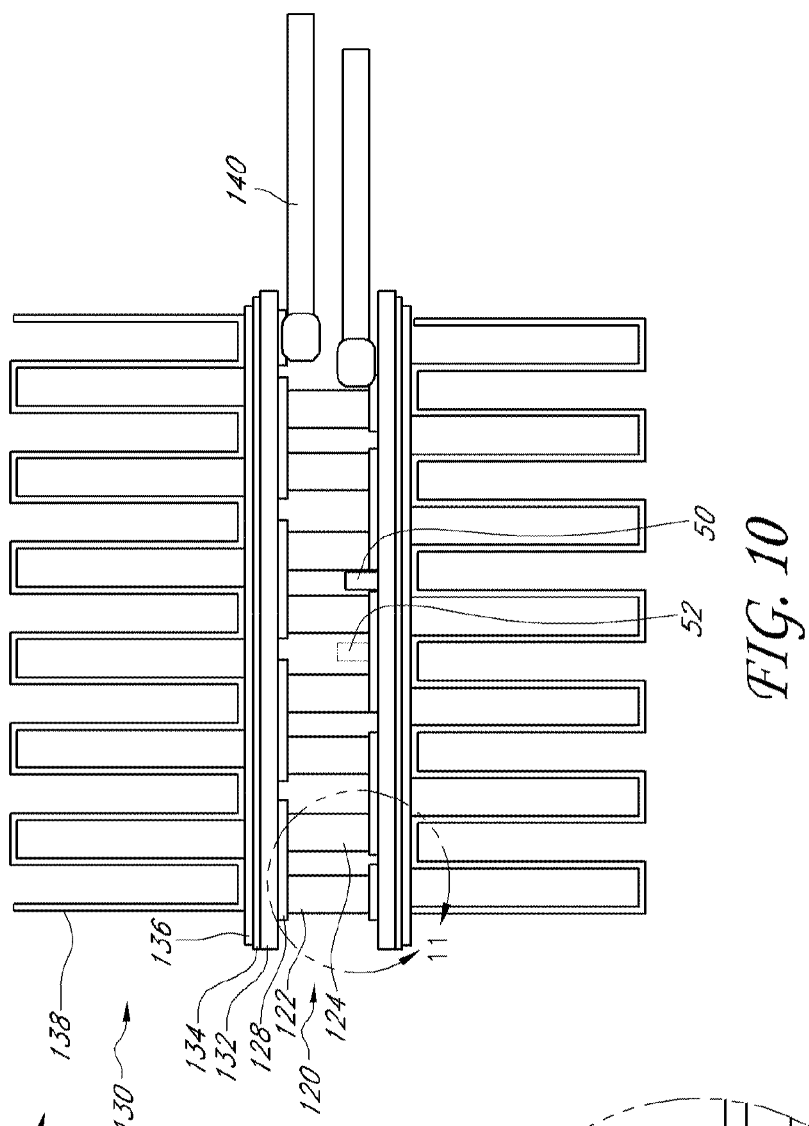
FIG. 10 illustrates a side view of the thermoelectric device of FIG. 8.
Figure 11:
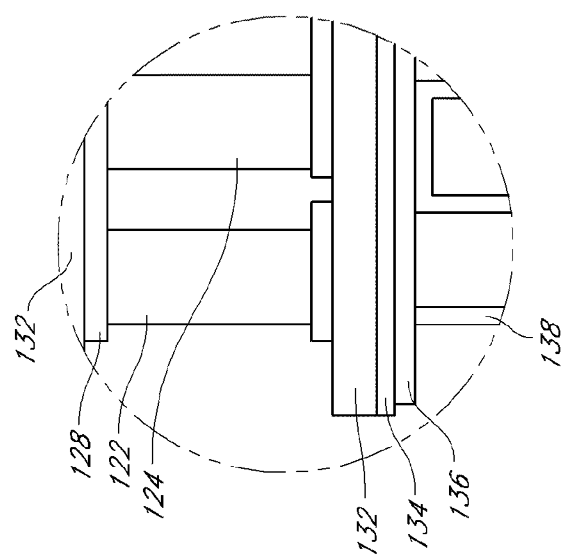
FIG. 11 illustrates an enlarged view of a portion of the thermoelectric device depicted in FIG. 10.

FIGS. 8-11 illustrate one embodiment of a thermoelectric device 110 that can be configured to include one or more intermediate electrical terminals as disclosed herein. FIG. 8 illustrates an exploded view of one embodiment of a thermoelectric device 110 with its various components separated for ease of inspection. FIG. 9 illustrates a side perspective view of the assembled thermoelectric device 110. In addition, FIG. 10 illustrates a side view of the thermoelectric device 110 with portions removed. Further, FIG. 11 illustrates an enlarged view of a portion of the thermoelectric device 110 depicted in FIG. 10.

With initial reference to FIGS. 8 and 9, the thermoelectric device 110 can include a plurality of dissimilar conductive elements 122, 124. As is discussed in greater detail herein, pairs of dissimilar conductive elements 122, 124 can be coupled together by a plurality of opposing conductor tabs 128. In some arrangements, such conductor tabs 128 are generally disposed between a pair of opposing substrates 132. In the illustrated embodiment, each substrate 32 is thermally coupled to one or more heat transfer members 138 (e.g., fins) through a thermal conductive element 134. A temperature sensor 150 can be positioned between the opposing substrates 132. In addition, a seal 160 can be provided between the opposing substrates 132 to protect the sensor 150 and the elements between the substrates 132.

FIGS. 10 and 11 illustrate side views of the thermoelectric device 110 with the seal 160 omitted to facilitate inspection of the conductive elements 122, 124, 128 that are generally located between the substrates 132. In one embodiment, the thermoelectric device 110 comprises alternating N-type semiconductor elements 122 and P-type semiconductor elements 124. The N-type semiconductor elements 122 and P-type semiconductor elements 124 can comprise bismuth-tellurium alloy ($Bi_2Te_3$), other doped or non-doped metals and/or any other materials. The end of each of the N-type semiconductor elements 122 and P-type semiconductor elements 124 can be coated with a diffusion barrier (not shown). The diffusion barrier can advantageously inhibit the flow of electrons out of the semiconductor elements 122, 124. Such a diffusion barrier can comprise any of a number of materials, such as, for example, nickel, a titanium/tungsten alloy, molybdenum and/or the like.

As illustrated in the embodiment of FIG. 10, pairs of dissimilar conductive elements 122, 124 can be coupled at their tops and bottoms using conductor tabs 128. In some arrangements, conductive elements 122, 124 of the same type are not disposed on the same tab 128. For example, each conductor tab 128 can be coupled to only one N-type semiconductor element 122 and only one P-type semiconductor elements 124. In addition, the upper and lower conductor tabs 128 can be configured so that the semiconductor elements 122, 124 are disposed in an alternating series. In this manner, the semiconductor elements 122, 124 are electrically connected in series with each other. However, with respect to thermal energy, the elements 122, 124 include a parallel orientation relative to each other.

With continued reference to FIG. 10, a first N-type semiconductor element 122 can be coupled at its top to a first conductor tab 128. Such a conductor tab 128 can also be coupled to a first the P-type semiconductor element 124 to the right of the first N-type semiconductor element 122. At the bottom of the first N-type semiconductor element 122, a second conductor tab 128 can be coupled to the first N-type semiconductor element 122 and can be coupled to a second P-type semiconductor element 124 to be disposed to the left of the first N-type thermoelectric element 122. The thermoelectric device can be configured such that all the semiconductor elements 122, 124 are connected in series with each other. It should be appreciated that the conductor tabs 128 can comprise a plurality of discrete elements coupled to the substrate 132 or an intermediate member. In modified embodiments, the tabs 128 can be formed by tracing or otherwise forming a layer of conductive material on the substrate and/or an intermediate element.

As illustrated in FIG. 10, a sensor 150 can be disposed on either substrate 132 between the semiconductor elements 122, 124. In other arrangements, one or more sensors 150 can be positioned at any other location of the thermoelectric device 110. The sensor 150 can be adapted to measure a temperature of the device 110, the air or other fluid being thermally conditioned by the device 110 and/or the like. It will be appreciated that the device 110 can comprise other types of sensors, either in addition to or in lieu of a temperature sensor.

As discussed, heat transfer assemblies 138 (e.g., fins) can be positioned on the top and/or bottom sides of the thermoelectric device 110. According to some embodiments, the thermoelectric device 110 is configured to operate without the heat transfer assemblies 138. However, the presence of such assemblies 138 can increase the efficiency of heat transfer from the thermoelectric device 110 to the air or other fluid passing near the thermoelectric device 110.

With continued reference to FIGS. 10 and 11, an electrically-conducting solder (not shown) can be used to mount the N-type semiconductor elements 122 and P-type semiconductor elements 124 to the conductor tabs 128. In one embodiment, the conducting solder can comprise one or more compounds of tin and antimony, other metals or non-metals and/or any other materials. For example, the solder can include an alloy comprising bismuth and tin. Other methods of affixing the semiconductor elements 122, 124 to the conductor tabs 128 can be used, provided an electrical connection is permitted between the semiconductor elements 122, 124 and the conductor tabs 128. In some embodiments, the conductor tabs 128 are mounted to the substrate 132 via an adhesive or other material.

The substrates 132 can be configured to provide electrical insulation while simultaneously providing for heat conduction. In one embodiment, the substrates 132 comprise a ceramic material, such as, for example, alumina (ceramic), silicon and/or the like. However, various other types of materials, such as, for example, epoxy, may be used. The substrates 132 can be configured to be sufficiently rigid in order to maintain the shape of the thermoelectric device 110. In other embodiments, flexible substrates can be used. When flexible substrates are used, a thermoelectric device can be constructed in various shapes and may have the ability to bend from one shape to another. As discussed, the substrates 132 can act an electrical insulator. The typical thickness for a substrate 132 can be between 50 and 500 micrometers. However, in other embodiments, the thickness of the substrate 132 can be less than 50 micrometer or greater than 500 micrometers, as desired or required. In some embodiments, the substrates 132 can be sufficiently large to completely cover the semiconductor elements 122, 124 and the conductor tabs 128. The conductor tabs 128 can be coupled to the electrically-insulating substrate 132 through solder, epoxy and/or any other mounting mechanism, device or method.

With continued reference to FIGS. 10 and 11, a heat transfer layer 134 can be disposed between the substrate 132 and the heat transfer member 138. Accordingly, the heat transfer layer 134 can be disposed on the outside of each of the substrates 132. In one embodiment, the heat transfer layer 134 comprises a plate composed of copper and/or other materials that have a relatively high thermal conductivity. In some arrangements, the thickness of the heat transfer layer 134 can be between 10 and 400 micrometers. However, the thickness of the heat transfer layer 134 can be different as desired or required by a particular application. The heat transfer member 138 can be coupled to the heat transfer layer by a layer of heat-conducting solder 136. In the illustrated embodiment, the heat transfer member 138 comprises a material of high thermal conductivity (e.g., copper) that is generally shaped into a plurality of fins. Other materials or shapes can also be used, such as copper alloys or circular members. Additionally, the heat transfer between the heat transfer member 138 and the surrounding environment can be enhanced by providing a fluid transfer device (e.g., a fan) to move fluid (e.g., air) over and/or through the heat transfer member 138.

When a current is passed through the N-type semiconductor elements 122 in series with the P-type semiconductor elements 124, one junction 128 on one side of the semiconductor elements 122, 124 is heated and a junction 128 on the other side of the thermoelectric elements 122, 124 is cooled. That is, when a voltage is applied in one direction in series through the semiconductor elements 122, 124, alternating junctions 128 of the N-type semiconductor elements 122 and P-type semiconductor elements 124 will heat and cool respectively. In the embodiment depicted in FIG. 10, the junctions 128 of the semiconductor elements 122, 124 alternate along the top and bottom of the device 110. Thus, when a voltage is applied in one direction through the semiconductor elements 122, 124, the top of the thermoelectric device 110 heats and the bottom of the thermoelectric device 110 cools. When the current direction is reversed, the top of the thermoelectric device 110 is cooled and the bottom is heated. Current can be applied to the device 110 through electrical connectors 140, which can be electrically coupled one of the junctions 128.

The thermoelectric device 110 illustrated and described herein can comprise one or more intermediate electrical terminals as discussed with reference to FIGS. 1-7B. In addition, the device 110 can include one or more switches or other components, as desired or required for the proper operation of the device 110.

As discussed, a sensor 150 can be disposed between the semiconductor elements 122, 124. The sensor 150 can be configured to determine any of a number of states of operation of the thermoelectric device 110. For example, the sensor 150 can comprise a temperature sensor, such as a thermistor. In some embodiments, a thermistor with an internal resistance of about 1000Ω can be used. Sensors having other resistances and/or completely different types of sensors that detect different operating states of the device 110 can also be used (e.g., thermocouples, resistance thermometers, etc.). In some arrangements, the sensor 150 can determine the temperature of the thermoelectric device 110 at a point located among the semiconductor elements 122, 124. The sensor 150 can be disposed on a conductor tab 128 (e.g., element 152) generally between an N-type semiconductor element 122 and a P-type semiconductor element 124. Alternatively, the sensor 150 can be located between any two conductor elements 122, 124 while mounted or placed on the substrate 132. In a modified embodiment, the sensor 150 can be disposed between a semiconductor element 122, 124 and the edge of the substrate 132.

As illustrated in FIG. 10, the electrical connectors 140 can form the end terminals T1 and T2 as described herein with reference to FIGS. 1-7B. To provide one or more intermediate terminals in accordance with some of the embodiments disclosed herein, one or more connectors can be provided between the first and second terminals T1, T2.

Figure 12:
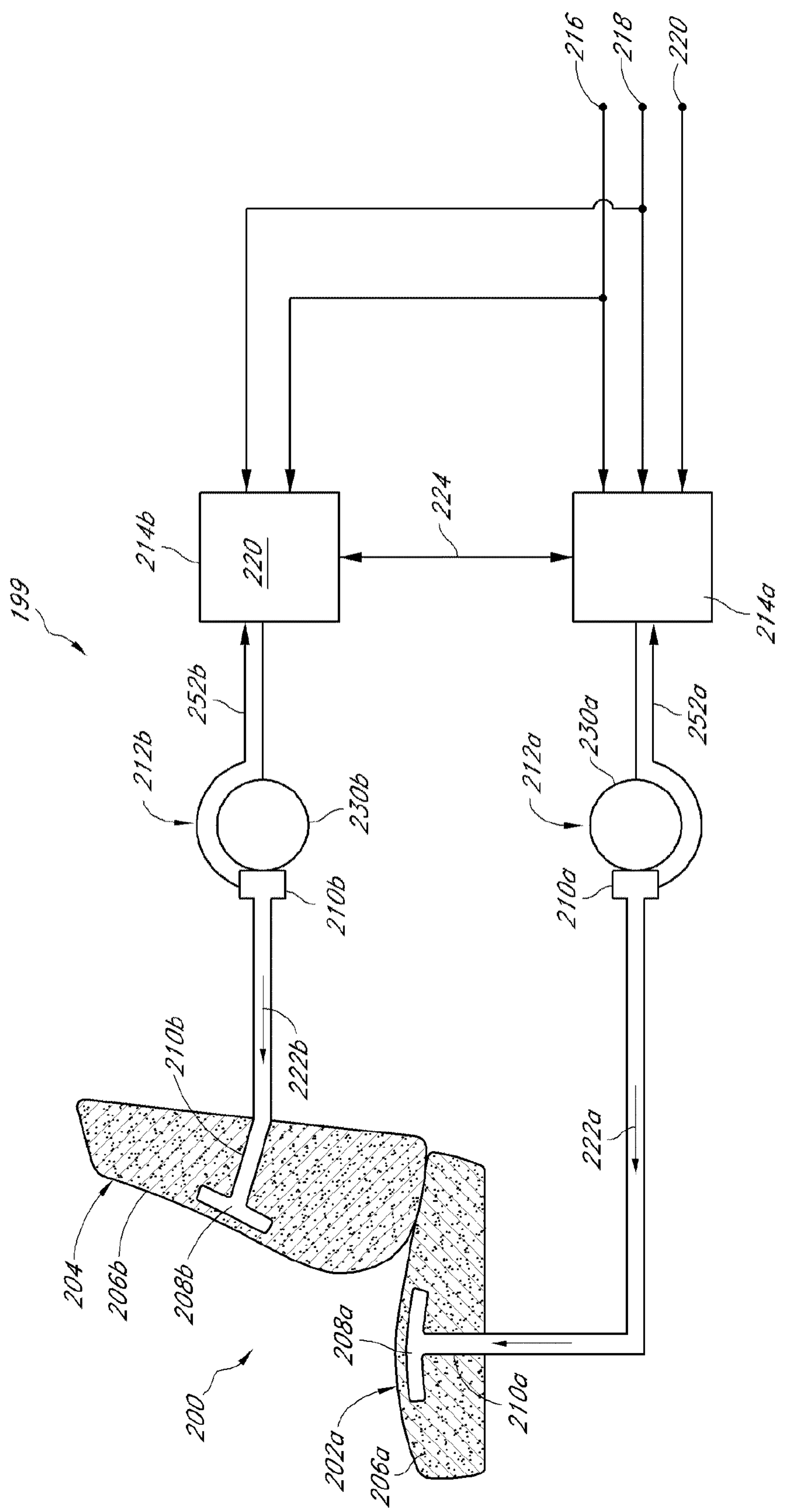
FIG. 12 is a schematic illustration of a climate control system for a seating assembly comprising thermoelectric devices in accordance with various embodiments disclosed herein.

In FIG. 12, a climate control system 199 for a seat assembly 200 is shown in combination with a pair of thermoelectric devices 210*a*, 210*b*. Such thermoelectric devices 210*a*, 210*b* can be arranged and configured as described above. For example, in some embodiments, one or more of the thermoelectric devices 210*a*, 210*b* comprise an intermediate terminal to selectively direct electrical current through only a portion of the respective circuit. In some embodiments, the seat assembly 200 is similar to a standard automotive or other vehicle seat. However, it should be appreciated that certain features and aspects of the climate control system 199 and seat assembly 200 disclosed herein can also be used in a variety of other applications and environments. For example, certain features and aspects of the system 199 and assembly 200 may be adapted for use in other vehicles, such as, for example, airplane, trains, boats and the like. In addition, the features, aspects and other details of the system 199 and assembly 200 can be applied to other types of seating assemblies, such as, for example, wheelchairs, beds, sofas, office chairs and other types of chairs, theater seats and/or the like.

With continued reference to FIG. 12, the seat assembly 200 can comprise a seat portion 202 and a back portion 204. The seat portion 202 and back portion 204 can each comprise a cushion 206*a*, 206*b* and a plurality of channels 208*a*, 208*b* disposed within and/or extending through the cushions 206*a*, 206*b*. Each of the channels 208*a*, 208*b* can be placed in fluid communication with the climate control system 199 through a conduit 210*a*, 210*b*. The conduits 210*a*, 210*b*, in turn, can be in fluid communication with separate climate control devices 212*a*, 212*b*. In the illustrated embodiment, the channels 208*a* associated with the seat portion 202 are in communication with a different climate control device 212*a* than the channels 208*b* in the back portion 204. However, in other embodiments, a single climate control device can be in fluid communication with the channels 208*a*, 208*b* of both the seat portion 202 and back portion 204. In yet other embodiments, multiple climate control devices can be associated with either the seat portion 202 and/or the back portion 204. In some embodiments, the channels 208*a*, 208*b* and/or conduits 210*a*, 210*b* can include resistive heating elements (not shown).

In the illustrated embodiment, the climate control devices 212*a*, 212*b* can each comprise a thermoelectric device 210*a*, 210*b*, which can be configured as described above (e.g., having one or more intermediate electrical terminals), and a fluid transfer device 230*a*, 230*b*. The fluid transfer device 230*a*, 230*b* can comprise a radial or axial fan, or any other device for transferring a fluid. Each thermoelectric device 210*a*, 210*b* can be disposed between a fluid transfer device 230*a*, 230*b* and the respective conduit 210*a*, 210*b*. As discussed, the thermoelectric device 210*a*, 210*b* can be configured to selectively heat or cool a fluid (e.g., air) delivered by the fluid transfer device 230*a*, 230*b* to the seat portion 202 and/or back portion 204. The fluid transfer device 230*a*, 230*b* can be configured to transfer air or other fluid to the channels 208*a*, 208*b* that is drawn past only one side of the thermoelectric device 210*a*, 210*b*. Accordingly, the climate control devices 212*a*, 212*b* can be configured to selectively supply heated or cooled air 222*a*, 222*b* through the plurality of conduits 210*a*, 210*b* to the seat assembly 200. The fluid transfer device 230*a*, 230*b* can also be used to withdraw air through the conduits 210*a*, 210*b*. In yet other arrangements, heated and/or cooled air or other fluid can be delivered to any other portion of the seat assembly 200 (e.g., neck rest area), either in lieu of or in addition to the plurality of conduits 210*a*, 210*b*.

In the embodiment illustrated in FIG. 12, each of the thermoelectric devices 210*a*, 210*b* includes a pair of heat transfer members 238 as described herein. The heat transfer members 238 form a waste heat exchanger and a generally opposing main heat exchanger, which can be thermally exposed to the air or other fluid transferred by the fluid transfer device 230*a*, 230*b*. Depending upon the mode of operation, heat can be transferred to the air or other fluid through the main heat exchanger or withdrawn from the air or other fluid through the main heat exchanger.

The climate control devices 212*a*, 212*b* can be controlled and operatively connected by an electronic control device 214*a*, 214*b*. The electronic control devices 214*a*, 214*b* can receive signals from a plurality of input sources 216, 218, 220. In the illustrated embodiment, three input sources are shown, but more or fewer can be used. The electronic control devices 214*a*, 214*b* can be operatively connected with each other through an information connection 224. The electronic control devices 214*a*, 214*b* can be configured change the operating state of the climate control devices 212*a*, 212*b* in response to a control signal or setting. For example, the electronic control devices 214*a*, 214*b* can alter the speed at which fluid is transferred by the fluid transfer devices 230*a*, 230*b* or the operating state of the thermoelectric devices 210*a*, 210*b* to heat or cool the fluid. One or more sensors 150 (FIGS. 8-11) disposed in the thermoelectric devices 210*a*, 210*b* can impart information through one or more hardwired and/or wireless connections to the electronic control devices 214*a*, 214*b*. This can permit the devices 214*a*, 214*b* to accurately determine the operating temperature of the climate control devices 212*a*, 212*b*. The electronic control devices 214*a*, 214*b* can adjust the operation of the climate control devices 212*a*, 212*b* based at least in part on information provided by a sensor. For example, the electronic control devices 214*a*, 214*b* can change the direction or strength of current in the thermoelectric devices 210*a*, 210*b*, change the speed of operation of the fluid transfer device 230*a*, 230*b*, and/or shut down the devices 210*a*, 210*b* if there is a malfunction.

In other embodiments, the electronic devices 214*a*, 214*b* can direct the electrical current through an end terminal or an intermediate terminal to a specific end terminal or other intermediate terminal as disclosed herein. This can permit the thermoelectric devices 210*a*, 210*b* to provide a desired or required level of heating and/or cooling.

Various components are described as being "operatively connected" to the control unit. It should be appreciated that this is a broad term that includes physical connections (e.g., electrical wires or hard wire circuits) and non-physical connections (e.g., radio or infrared signals). It should also be appreciated that "operatively connected" includes direct connections and indirect connections (e.g., through additional intermediate device(s)).

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while the number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with, or substituted for, one another in order to perform varying modes of the disclosed invention. Thus, it is intended that the scope of the present invention herein disclosed should not be limited by the particular disclosed embodiments described above, but should be determined only by a fair reading of the claims.

What is claimed is:

1. A thermoelectric system comprising:

a pair of opposing substrates, each substrate having a peripheral edge and a face that generally opposes a face of the other opposing substrate;

a plurality semiconductor elements positioned between the opposing faces of the opposing substrates, the plurality of semiconductor elements comprises at least two groups of dissimilar semiconductor elements, wherein the plurality of semiconductor elements are electrically coupled in series by conductor elements arranged so the two groups of dissimilar semiconductor elements are connected in an alternating pattern;

a first terminal, a second terminal and a third terminal electrically connected to the conductor elements with the third terminal being positioned electrically between the first and second terminals along a circuit created by the plurality of semiconductor elements electrically coupled in series by the conductor elements, and a switch electrically connected to at least one of the first, second and third terminals, so as to permit electric current to selectively flow between the first and second terminals and between the first and third terminals, wherein the switch permits a total number of semiconductor elements through which electric current passes to be adjusted;

wherein the electrically coupled semiconductor elements comprise a plurality of first nodes and a plurality of second nodes, wherein the first and second nodes emit or absorb heat according to electric current flowing through the semiconductor elements, and wherein an impedance of the thermoelectric system is controlled by activating the switch.

2. The thermoelectric system of claim 1, wherein the switch is electrically connected to the third terminal.

3. A thermoelectric system comprising:

a first couple of first and second dissimilar conductive elements, connected to each other at a first common node, the first couple comprising a first end and a second end;

a second couple of first and second dissimilar conductive elements, connected to each other at a second node, the second couple comprising a first end and a second end, the first end of the second couple being connected to the second end of the first couple at the second node;

a first terminal connected to the first end of the first couple;

a second terminal connected to the second end of the second couple; and a third terminal electrically connected to the second node through an electrical switch, wherein the electrical switch permits a total number of conductive elements through which electric current passes to be varied during operation of the system, wherein the first, second and third terminals are electrically coupled to a power source;

wherein the switch controls an electrical impedance of the thermoelectric system by switching electric current through the third terminal, wherein the switch permits electric current to be delivered through only some of the conductive elements.

4. The system of claim 3, wherein switching of the switch is associated with a flowing direction of the electric current through the thermoelectric system.

5. The system of claim 3, wherein the first terminal is connected to a first voltage, wherein the second terminal is connected to a second voltage, and wherein the switch is open such that electric current flows through the first and second couples of first and second dissimilar conductive elements.

6. The system of claim 3, wherein the first terminal is connected to a first voltage, wherein the second terminal is connected to a second voltage, wherein the third terminal is connected to the second voltage, and wherein the switch is closed such that electric current flows only through the first couple of first and second dissimilar conductive elements.

7. A thermoelectric system comprising:

a first dissimilar conductive element having a first end and a second end;

a second dissimilar conductive element having a first end and a second end, the first end of the second dissimilar conductive element being connected to the second end of the first dissimilar conductive element;

a first terminal connected to the first end of the first dissimilar conductive element;

a second terminal connected to the second end of the second dissimilar conductive element at a first node; and a third terminal electrically coupled to a contact point located between the first end of the first dissimilar conductive element and the first node through an electrical switch, wherein the first, second and third terminals are configured to electrically couple to a power source, wherein the electrical switch permits an electrical impedance of the thermoelectric system to be controlled during operation of the system by selectively switching electric current through the third terminal, wherein the electrical switch permits electric current to be delivered through only some of the conductive elements.

8. The system of claim 7, wherein the electrical switch comprises a slidable leg connected to the contact point between the first end of the first dissimilar conductive element and the first node.

9. The system of claim 7, wherein the electrical switch comprises multiple taps connected to a plurality of contact points between the first end of the first dissimilar conductive element and the first node, and wherein the electrical switch closes one of the multiple taps when activated.

10. The system of claim 9, wherein the electrical switch is configured to select one of the multiple taps, and wherein a flow of electric current through the first dissimilar conductive element is controlled by selecting of one of the multiple taps.

11. The system of claim 7, wherein the dissimilar conductive element comprises a P-type semiconductor and a N-type semiconductor.

12. The system of claim 7, wherein the switching electric current through the third terminal limits the amount of heating or cooling produced by the thermoelectric system.

* * * * *